United States Patent
Kaneko et al.

(10) Patent No.: US 6,403,990 B1
(45) Date of Patent: Jun. 11, 2002

(54) SHORT TURN-OFF TIME PHOTOCONDUCTIVE SWITCH

(75) Inventors: Yasuhisa Kaneko, Kawasaki; Mitsuchika Saito, Kanagawa, both of (JP); Christopher Kocot, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/819,101

(22) Filed: Mar. 27, 2001

(51) Int. Cl.[7] .................................... H01L 31/109
(52) U.S. Cl. .................... 257/184; 257/13; 257/183; 257/185; 257/188
(58) Field of Search ................. 257/183, 184, 257/185, 188, 189, 191, 201, 431, 13

(56) References Cited

U.S. PATENT DOCUMENTS

| | | | | |
|---|---|---|---|---|
| 5,332,918 A | * | 7/1994 | Smith et al. | 257/184 |
| 5,485,018 A | * | 1/1996 | Ogawa et al. | 257/14 |
| 5,661,328 A | * | 8/1997 | Itatani et al. | 257/432 |
| H1717 H | * | 4/1998 | Stoudt et al. | 257/431 |
| 6,252,221 B1 | * | 6/2001 | Kaneko et al. | 250/214 LA |

* cited by examiner

*Primary Examiner*—Eddie Lee
*Assistant Examiner*—N. Drew Richards
(74) *Attorney, Agent, or Firm*—Ian Hardcastle

(57) ABSTRACT

The photoconductive switch comprises a first confinement layer, a second confinement layer, a photoconductive layer that includes a doped sub-layer and an undoped sub-layer, a first electrode and a second electrode. The first confinement layer is a layer of a first semiconductor material having a first band-gap energy and a first conductivity type. The second confinement layer is a layer of a second semiconductor material having a second band-gap energy. The photoconductive layer is a layer of a third semiconductor material having a third band-gap energy and a second conductivity type, opposite to the first conductivity type. The photoconductive layer is sandwiched between the first confinement layer and the second confinement layer, and the third band-gap energy is less than the first and second band-gap energies. In the photoconductive layer, the doped sub-layer is in contact with the first confinement layer, and the undoped sub-layer is adjacent the second confinement layer. The first electrode and the second electrode are separate from each other and are located on the surface of the first confinement layer remote from the photoconductive layer.

20 Claims, 4 Drawing Sheets

SHORT TURN-OFF TIME PHOTOCONDUCTIVE SWITCH

FIELD OF THE INVENTION

The invention relates to a photoconductive switch for switching electrical signals.

BACKGROUND OF THE INVENTION

Switches for switching high-frequency electrical signals, such as microwave signals, need to have a low insertion loss in their ON state, and need to provide a high isolation in their OFF state. A photoconductive switch is capable of providing such characteristics. The conduction state, i.e., ON or OFF, of a photoconductive switch is controlled by incident light. A photoconductive switch has less interaction between the control signal and the signal being switched than an electrically-controlled switch such as a transistor. Moreover, a photoconductive switch has good switching performance for high-frequency signals.

U.S. Pat. No. 3,917,943 of Auston discloses a photoconductive switch (PCS) controlled by an ultra-short optical pulse and fabricated on a semiconductor substrate. Two gold micro-strip transmission lines separated by a narrow gap are located on the surface of a light-absorbing, semi-insulating semiconductor substrate. A first optical pulse directed at the substrate through the gap turns the PCS ON by generating copious electric charges near the substrate surface. A second optical pulse that begins during the first optical pulse and that is directed at the gap generates copious electric charges in the bulk of the substrate extending down to the ground plane. This shorts the micro-strip transmission lines to ground, and switches the PCS OFF.

The substrate is grown at a low temperature or is ion implanted to shorten the carrier lifetime to provide a fast switching response. However, these measures also reduce the carrier mobility, which causes the PCS to have a high insertion loss. In addition, the PCS requires a long time to reach its ultimate high resistance state after the second optical pulse has been asserted.

U.S. Pat. No. 4,755,663 to Derkits, Jr. indicates that a disadvantage of the Auston PCS is that the electrical impulse created by the optical pulse is dominated by carrier recombination, rather than carrier transport. Derkits discloses a PCS in which the portion of the substrate adjacent the gap includes a region composed of a graded-composition photosensitive semiconductor material having a grooved surface. Illuminating the substrate surface through the gap causes the PCS to conduct. The intensity of the light has to be sufficient to generate charge carriers at the surface of the photosensitive semiconductor material. Extinguishing the light turns the PCS OFF by generating a quasi-electric field that sweeps the charge carriers into a region of the substrate where a narrow band-gap energy material is predominant. In this region, the grooves separate the charge carriers and prevent further conduction between the electrodes.

However, the PCS disclosed by Derkits does not offer a sufficient performance improvement to enable it to meet present-day performance demands.

FIG. 1 shows a PCS 1 disclosed by two of the inventors of the present disclosure in U.S. patent application Ser. No. 09/337,045, assigned to the assignee of the present invention. This PCS has a low insertion loss in its ON state, a large isolation in its OFF state and is simple to fabricate. In the PCS 1, a thick, light-absorbing photoconductive layer of a semiconductor material having a narrow band-gap energy (NB material) is sandwiched between two thin confinement layers of a semiconductor material having a wide band-gap energy (WB material). The photoconductive switch 1 is composed of the substrate 13 on which are located the second confinement layer 12 of a WB material, the photoconductive layer 11 of an NB material and the first confinement layer 10 of a WB material. The electrodes 2 and 3 are located on the surface of the first confinement layer 10 and are separated from one another by the gap 4. The WB material of the first confinement layer 10 is doped n-type, and that of the photoconductive layer 11 is doped p-type.

Incident light 14 generated by a semiconductor light source (not shown), such as a laser, in response to an electrical control signal switches the PCS 1 ON. Switching OFF the incident light switches the PCS OFF.

The PCS 1 satisfies the basic performance requirements of having a low ON resistance and low OFF capacitance, but its dynamic switching response is not ideal. The dynamic switching response of the PCS 1, when tested using the test arrangement shown in FIG. 2A, exhibited the tailing characteristic illustrated in FIG. 2B.

In the test arrangement shown in FIG. 2A, the PCS 1 is connected in series between the DC power supply 21 and the load 22. The input of the oscilloscope 23 in connected in parallel with the load. The time base of oscilloscope is triggered by the electrical control signal (not shown) of the PCS. The dynamic switching response of the PCS 1 is observed using the oscilloscope.

The electrical control signal changing from its 0 state, in which the PCS 1 is OFF, to its 1 state, in which the PCS is ON, caused the PCS 1 to turn ON rapidly, as shown at 24 in FIG. 2B. The electrical control signal changing from its 1 state to its 0 state caused the PCS 1 to turn part-way OFF rapidly, as shown at 25. The PCS 1 then continued to turn OFF much more slowly than the initial rate 25, as shown at 26, and was still in a partly-ON state after as long as 100 $\mu$s. The prolonged, gradual turn-off response shown in FIG. 2B will be called a tailing characteristic in this disclosure. A tailing characteristic is normally undesirable in the switching operation of a switch. Therefore, the need exists in the PCS just described to eliminate the tailing characteristic without degrading the low ON resistance, the low OFF capacitance and other desirable aspects of the performance of the PCS.

SUMMARY OF THE INVENTION

The invention provides a photoconductive switch that comprises a first confinement layer, a second confinement layer, a photoconductive layer that includes a doped sub-layer and an undoped sub-layer, a first electrode and a second electrode. The first confinement layer is a layer of a first semiconductor material having a first band-gap energy and a first conductivity type. The second confinement layer is a layer of a second semiconductor material having a second band-gap energy. The photoconductive layer is a layer of a third semiconductor material having a third band-gap energy and a second conductivity type, opposite to the first conductivity type. The photoconductive layer is sandwiched between the first confinement layer and the second confinement layer, and the third band-gap energy is less than the first and second band-gap energies. In the photoconductive layer, the doped sub-layer is in contact with the first confinement layer, and the undoped sub-layer is adjacent the second confinement layer. The first electrode and the second electrode are separated from each other by a gap, and are located on the surface of the first confinement layer remote from the photoconductive layer.

The doped sub-layer may be a first doped sub-layer, and the photoconductive layer may additionally include a second doped sub-layer in contact with the second confinement layer.

The photoconductive switch may additionally comprise a graded composition layer or a chirped super lattice multi-layered film sandwiched between the photoconductive layer and the first confinement layer.

The sub-layers of the photoconductive layer substantially eliminate the above-mentioned tailing characteristic from the dynamic switching response of the photoconductive switch without significantly increasing the capacitance and resistance of the photoconductive switch.

DETAILED DESCRIPTION OF THE INVENTION

A first embodiment 100 of a photoconductive switch according to the invention will now be described with reference to FIGS. 3A and 3B. The dynamic switching response of the photoconductive switch according to the invention does not exhibit the above-mentioned tailing characteristic.

Figure 3A:
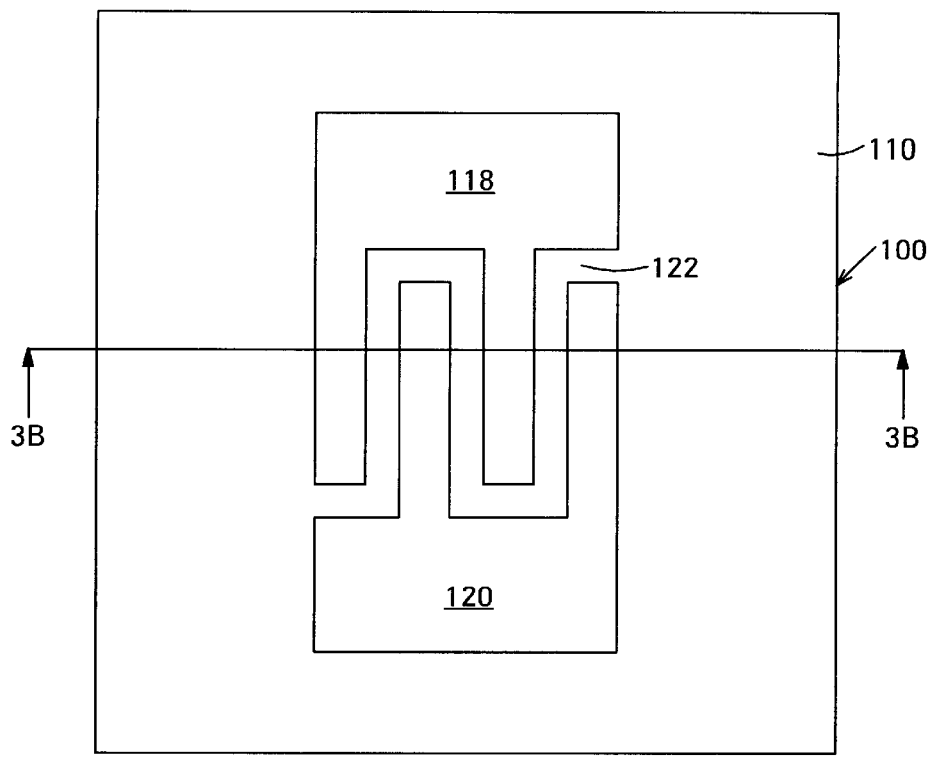
FIG. 3A is a plan view of a first embodiment of a photoconductive switch according to the invention.
Figure 3B:
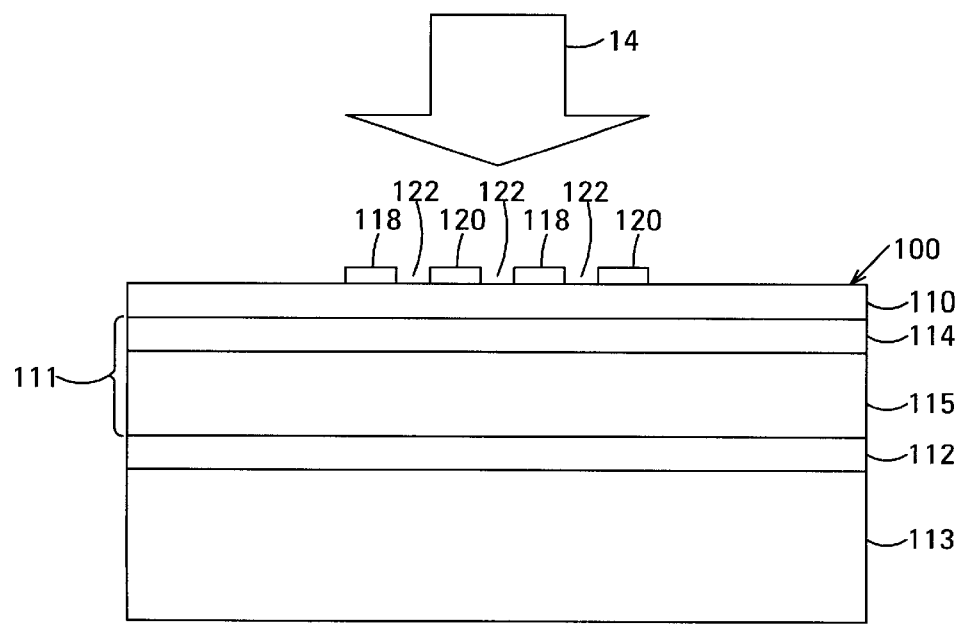
FIG. 3B is a cross-sectional view of the photoconductive switch shown in FIG. 3A along the line 3B—3B.

FIGS. 3A and 3B are plan and cross-sectional views, respectively, the photoconductive switch 100. The photoconductive switch is composed of the substrate 113 on which are successively located the second confinement layer 112 of a semiconductor material having a wide band-gap energy (WB material), the photoconductive layer 111 of a semiconductor material having a narrow band-gap energy (NB material) and the first confinement layer 110 of a WB material.

The band-gap energies of the WB material and the NB material are "wide" and "narrow" in relation to the photon energy of the incident light 14 that controls the PCS 100. The band edges of the WB materials of the confinement layers 110 and 112 are higher than the photon energy of the incident light whereas the band edge of the NB material of the photoconductive layer 111 is lower than the photon energy of the incident light. Selecting the WB and NB materials such the band-gap energies of the WB materials of the confinement layers 110 and 112 are more than 25 meV greater than the band-gap energy of the NB material of the photoconductive layer 111 prevents the carriers generated in the photoconductive layer in response to the incident light 14 from diffusing into the confinement layers. The band-gap energy difference of 25 meV corresponds to thermal energy at room temperature.

The electrodes 118 and 120 are located on the exposed surface of the first confinement layer 110. The electrodes 118 and 120 are separated from one another by the narrow gap 122. FIG. 3A shows an example in which the electrodes are interdigitated.

The photoconductive layer 111 is sandwiched between the first confinement layer 110 and the second confinement layer 112 and includes the doped sub-layer 114 adjacent the first confinement layer 110. The remainder of the photoconductive layer constitutes the undoped sub-layer 115.

In an embodiment of the PCS 100, the first confinement layer 110 has a thickness of about 70 nm and the WB material of this layer is doped to make its conductivity n-type with an electron concentration of about $3 \times 10^{17}$ cm$^{-3}$. The photoconductive layer 111 has a thickness of about 1.5 μm and its conductivity is p-type. The hole concentration of the doped sub-layer 114 will be described below. The hole concentration in the undoped sub-layer 115 is about $1 \times 10^{14}$ cm$^{-3}$. This hole concentration results from growing the NB material of the undoped sub-layer without any added dopant. The conductivity type of the second confinement layer 112 is p-type with a hole concentration of about $1 \times 10^{14}$ cm$^{-3}$. This hole concentration also results from growing the WB material of the second confinement layer without any added dopant.

The undoped sub-layer 115 is undoped in the sense that no dopant is added when the sub-layer is grown. However, in this disclosure, a semiconductor material having a carrier concentration of less than about $1 \times 10^{15}$ cm$^{-3}$ will be regarded as being undoped, regardless of whether or not the carrier concentration of the material has been achieved by means of an added dopant.

The sub-layers included in the photoconductive layer 111 eliminate the tailing characteristic from the dynamic switching response of the photoconductive switch 100 without significantly increasing the ON resistance or the OFF capacitance of the photoconductive switch. The doped sub-layer 114 provides a high doping concentration at the interface between the WB material of the first confinement layer 110 and the NB material of the photoconductive layer. The high doping concentration reduces the thickness of the depletion layer that exists at this interface, and therefore accelerates carrier recombination when the incident light 14 is switched off.

A homogeneous photoconductive layer with a doping level similar to that of the doped sub-layer 114 would also provide a high doping concentration at the interface between the WB material of the first confinement layer 110 and the NB material of the photoconductive layer and could therefore eliminate the tailing characteristic. However, such a photoconductive layer would eliminate the tailing characteristic at the expense of undesirable increases in the ON resistance and the OFF capacitance of the PCs.

The doped sub-layer 114 of the PCS 100 according to the invention provides the advantage of a high doping concentration at the interface between the first confinement layer 110 and the photoconductive layer 111, but does not significantly increase the resistance and the capacitance of the PCS 100. Thus, the sub-layers included in the photoconductive layer 111 provide the PCS 100 with a switching response that lacks a tailing characteristic, a low OFF capacitance and a low ON resistance.

The product of the thicknesses and the doping concentration of the doped sub-layer 114 determines the effect of the doped sub-layer on reducing the tailing characteristic in the dynamic switching response and on increasing the OFF capacitance and the ON resistance of the PCS. An effective reduction in the tailing characteristic without an unacceptable increase in the resistance and capacitance of the PCS is obtained when the product of the thicknesses and the doping concentration is in the range from $1 \times 10^{11}$ to $5 \times 10^{12}$ cm$^{-3}$. Even better results are obtained with the product in the range from $2 \times 10^{11}$ to $2 \times 10^{12}$ cm$^{-3}$. In an embodiment, a doping concentration of $2 \times 10^{16}$ cm$^{-3}$ and a thickness of 250 nm were used.

Figure 1:
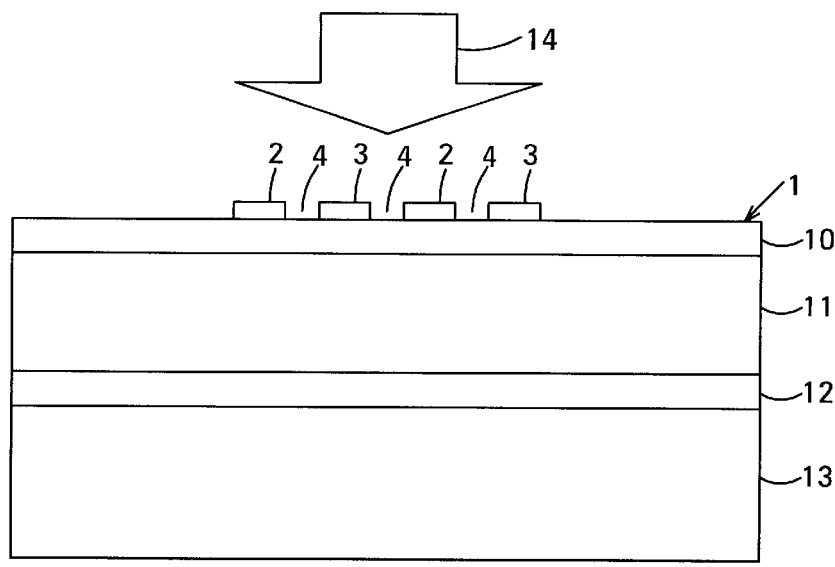
FIG. 1 is a cross-sectional view of a photoconductive switch previously disclosed by two of the inventors.
Figure 2A:
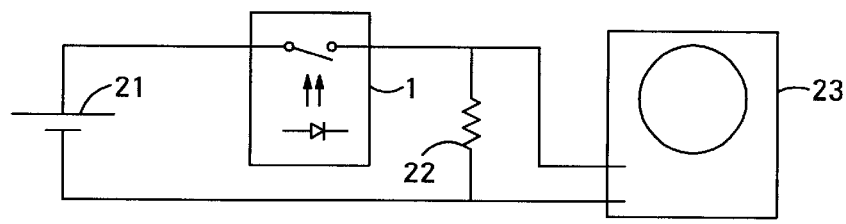
FIG. 2A is a schematic drawing of a test arrangement used test the dynamic switching response of a photoconductive switch.
Figure 2B:
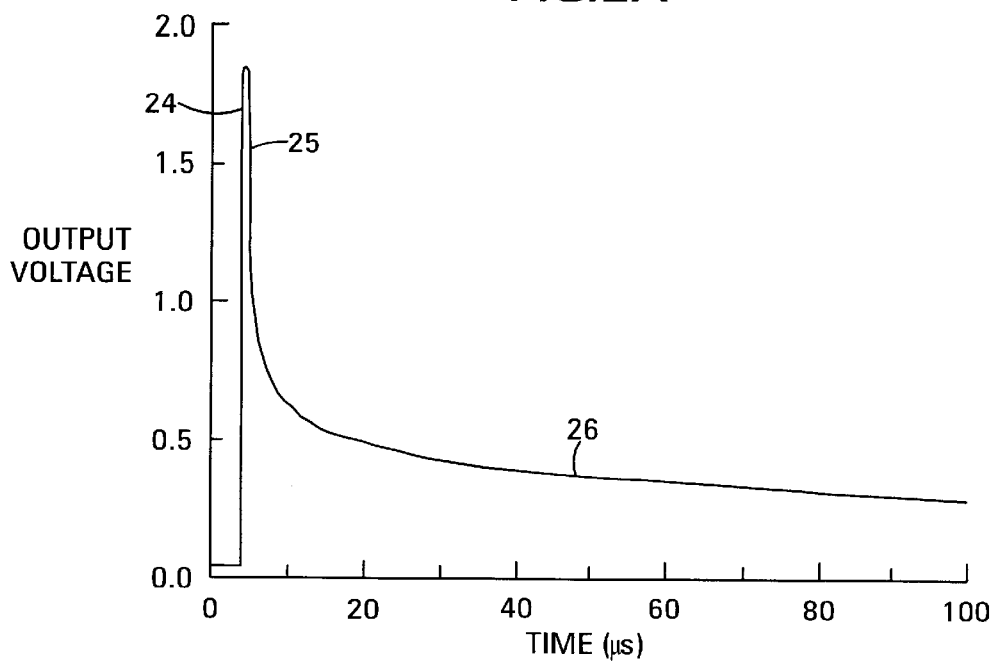
FIG. 2B is a graph showing the dynamic switching response of the photoconductive switch shown in FIG. 1.
Figure 4:
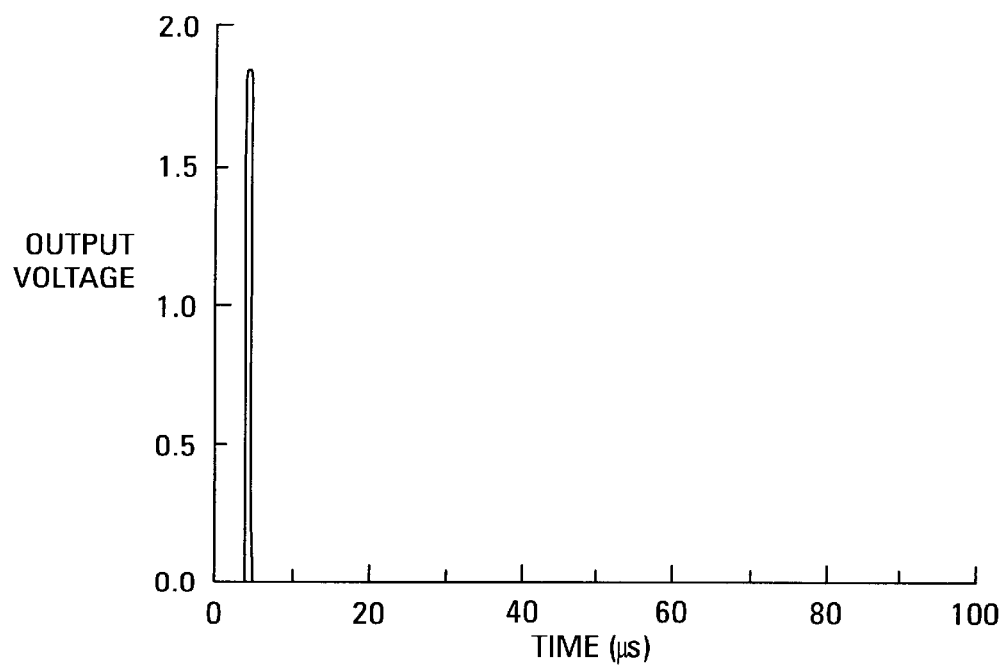
FIG. 4 is a graph showing the dynamic switching response of the photoconductive switch shown in FIGS. 3A and 3B.

FIG. 4 shows the dynamic switching response of a sample of the photoconductive switch 100 according to the invention. The switching response was tested using the test arrangement shown in FIG. 2A. As can be seen by comparing of the results shown in FIGS. 2B and 4, the two sub-layer structure of the photoconductive layer 111 of the PCS 100 according to the invention successfully eliminates the tailing characteristic from the dynamic switching response.

A practical example of the PCS 100 was made by growing on the semi- insulating GaAs substrate 113 the undoped, 70 nm-thick Al$_{0.3}$Ga$_{0.7}$As second confinement layer 112, the undoped, 1.70 μm-thick undoped sub-layer 115 of the GaAs photoconductive layer 111, the 250 nm-thick doped sub-layer 114 of the GaAs photoconductive layer doped at $p=2 \times 10^{16}$ cm$^{-3}$, and the 70 nm-thick-n-type Al$_{0.23}$Ga$_{0.77}$As first confinement layer 110 doped at $n=3 \times 10^{17}$ cm$^{-3}$. The layers and sub-layers were grown in the order stated using molecular-beam epitaxy (MBE) or another suitable epitaxial growth technique. The confinement layers may have composition ratios different from those just described. However, an aluminum fraction in the first confinement layer 110 of less than 0.25 keeps the density of deep levels or DX centers relatively low. Too high a density of DX centers can reduce the free electron concentration in the first confinement layer and can lead to a significant increase the ON resistance.

An electrode layer with a thickness of 200 nm was then deposited on the exposed surface of the first confinement layer 110. The electrode layer was composed of sub-layers of titanium, platinum and gold with thicknesses of 10 nm, 90 nm and 100 nm, respectively. Alternative materials for the electrode layer are known in the art and include Ti/W, W/Si, Mo/Au, Pd/Au and Ti/Pd/Au. The electrode layer was then etched to define the electrodes 118 and 120 and the gap 122.

The PCS 100 was switched ON by illuminating a region of the exposed surface of the first confinement layer 110 with a beam of incident light 14 generated by a semiconductor laser (not shown). The region illuminated was that where the electrodes 118 and 120 are interdigitated. The wavelength of the incident light was selected so that the photon energy is below the band edge of the WB material of the first confinement layer 110 and is above the band edge of the NB material of the photoconductive layer 111. In the example just described, the incident light had a wavelength of about 0.78 μm. The beam of incident light had a substantially-circular cross section about 30 μm in diameter. Suitable semiconductor lasers are commercially available and help the PCS 100 to be manufactured at low cost.

Figure 5:
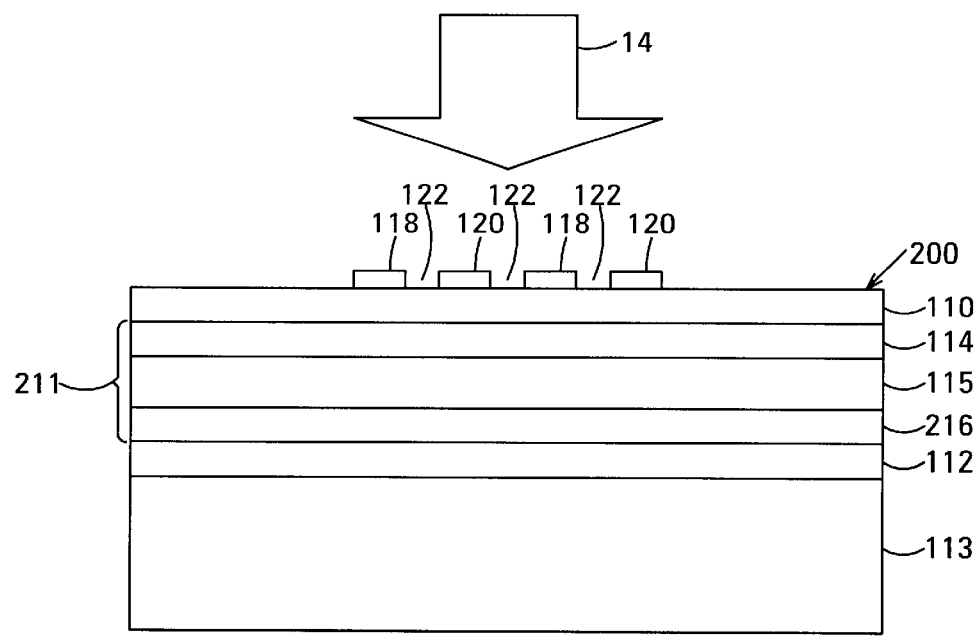
FIG. 5 is a cross-sectional view of a second embodiment of a photoconductive switch according to the invention.

FIG. 5 is a cross-sectional view of a second embodiment 200 of a photoconductive switch according to the invention. Elements of the photoconductive switch 200 that correspond to elements of the photoconductive switch 100 shown in FIG. 3B are indicated by the same reference numerals and will not be described again here.

The photoconductive switch 200 includes the photoconductive layer 211 fabricated from an NB material and sandwiched between the first confinement layer 110 and the second confinement layer 112. In the photoconductive layer 211, the doped sub-layer 114 adjacent the first confinement layer 110 is a first doped sub-layer and the photoconductive layer additionally includes the second doped sub-layer 216 adjacent the second confinement layer 112. The remainder of the photoconductive layer constitutes the undoped sub-layer 115 sandwiched between the first and second doped sub-layers 114 and 216.

The first doped sub-layer 114 and the second doped sub-layer 216 are doped p-type. The range of the product of the thickness and doping concentration of the NB material of the first doped sub-layer 114 is described above. In an embodiment, the second sub-layer 216 had a thickness of 250 nm and was doped p-type with a doping concentration of $2 \times 10^{16}$ cm$^{-3}$. Other combinations of thickness and doping concentration having a product in the same range as that of the first doped sub-layer 114 may alternatively be used. The second doped sub-layer further reduces the tailing characteristic, optimizes capacitance and maintains a high breakdown voltage.

A practical example of the PCS 200 was made by a method similar to that described above, except that, after the second confinement layer 112 was grown, the p-type second doped sub-layer 216 (250 nm-thick and doped at $p=2 \times 10^{16}$ cm$^{-3}$) was grown on the second confinement layer and the undoped sub-layer 115 was grown on the second doped sub-layer.

The PCS 200 is controlled by incident light generated by a commercially-available semiconductor laser in a manner similar to the PCS 100.

Figure 6:
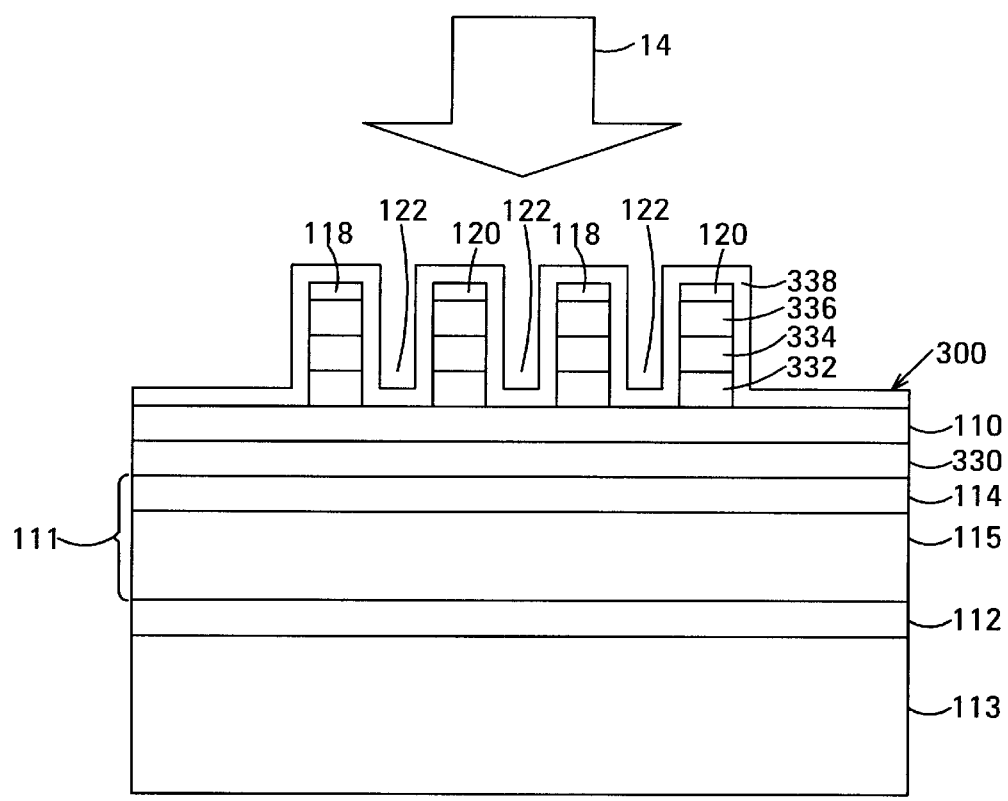
FIG. 6 is a cross-sectional view of a third embodiment of a photoconductive switch according to the invention.

FIG. 6 is a cross-sectional view of a third embodiment 300 of a PCS according to the invention. Elements of the PCS 300 that correspond to elements of the photoconductive switch 100 shown in FIG. 3B are indicated by the same reference numerals and will not be described again here.

The PCS 300 additionally includes the graded-composition layers 330 and 332, the cap layer 334, the contact layer 336 and the anti-reflective coating 338.

The graded composition layer 330 is a 30 nm-thick layer of n-type semiconductor material sandwiched between the photoconductive layer 111 and the first confinement layer 110. The doping concentration of the graded composition layer 330 is the same as that of the first confinement layer, i.e., about $3 \times 10^{17}$ cm$^{-3}$ in the example described above.

The material of the graded composition layer 330 is Al$_x$Ga$_{1-x}$As in which the value of the aluminum fraction x progressively increases from zero at the interface with the photoconductive layer 111 to a value equal to the aluminum fraction of the WB material of the first confinement layer 110 at the interface with the first confinement layer, i.e., 0.23 in the example described above.

The graded composition layer 332 is a 30 nm-thick layer of n-type semiconductor material sandwiched between the first confinement layer 110 and the cap layer 334. The doping concentration of the graded composition layer 332 is also the same as that of the first confinement layer.

The material of the graded composition layer 332 is also Al$_x$Ga$_{1-x}$As in which the value of the aluminum fraction x progressively decreases from a value equal to the aluminum fraction at the first confinement layer 110 at the interface with the first confinement layer to zero at the interface with the cap layer 334.

The cap layer 334 is a 200 nm-thick layer of n-type GaAs doped at $n=5 \times 10^{18}$ cm$^{-3}$, and is sandwiched between the graded-composition layer 332 and the contact layer 336. Highly n-doped InGaAs or highly n-doped Ge are alternative materials for the cap layer.

The contact layer 336 is a 20 nm-thick layer of n-type $In_{0.5}Ga_{0.5}As$ doped at $n=2\times10^{19}$ cm$^{-3}$, and is sandwiched between the cap layer 334 and the electrode layer in which the electrodes 118 and 120 are defined. The electrodes 118 and 120 form a non-alloy contact with the contact layer.

The electrodes 118 and 120 are composed of sub-layers of titanium, platinum and gold with a total thickness of 200 nm. Such an electrode structure provides a good electrical contact with the contact layer 336 without the need to anneal the electrode materials after they have been deposited.

Alternative electrode structures include:
(a) Ti(10 nm)/Pt(100 nm)/Au(100 nm) with no heat treatment, or with annealing to form an alloy that includes Pt;
(b) Ti(10 nm)/AuGe(88:12, 100 nm)/Ni(10 nm)/Au(200 nm), annealed at a temperature up to 360° C. The Au fraction may vary +5%;
(c) Ti(10 nm)/AuGeNi(86:10:4, 100 nm)/Au(200 nm), annealed at a temperature up to 360° C.;
(d) Ti(10 nm)/Au(10 nm)/Ge(100 nm)/Ni(10 nm)/Au(200 nm), annealed at a temperature up to 360° C.;
(e) Ni(5 nm)/NiIn(50:50, 10 nm)/W(30 nm), annealed at a temperature of about 900° C.; and
(f) Pd(10 nm)/Ge(50 nm)/Au(100 nm), annealed at a temperature up to 350° C.

In the above-listed electrode structures, the first-named material contacts the contact layer 336.

Other known electrode materials that may be used include Ti/W, Ti/Pd/Au, Ti/Pt/AuGeNi, W/Si, Wsi/W, Mo/Au, Pd/Au and Pd/Ge/Ti/Au.

The cap layer 334 and the contact layer 336 reduce the contact resistance between the graded-composition layer 332 and the electrodes 118 and 120. This reduction in the contact resistance is achieved without any heat treatment, such as annealing, being required. This method and structure for reducing contact resistance are based on the method of manufacturing heterojunction transistors (HBT) described by F. Ren et al. in 28 ELECTRON. LETT., 1150 (1992).

The anti-reflection coating 338 is a 100 nm-thick layer of silicon nitride ($Si_3N_4$) that covers the surface of the PCS 300 through which the incident light 14 is received. The anti-reflection coating covers the electrodes 118 and 120 and the exposed surface of the first confinement layer 110. The anti-reflection coating reduces the reflection of the incident light that would otherwise occur due to the large difference in refractive index between the AlGaAs of the first confinement layer 110 and the ambient, such as air.

A practical example of the PCS 300 was fabricated by successively growing the layers 112, 115, 114, 330, 110, 332, 334 and 336 on the GaAs substrate 113. Then a Ti/Pt/Au electrode layer in which the electrodes 118 and 120 and the gap 122 will be defined was deposited. In the Ti/Pt/Au electrode layer, the thicknesses of the layers of Ti, Pt and Au were 10 nm, 90 nm and 100 nm, respectively. The Ti/Pt/Au electrode layer was then patterned to define the electrodes 118 and 120 and the gap 122. The portions of the graded-composition layer 332, the cap layer 334 and the contact layer 336 between the electrodes were then etched away using the first confinement layer 110 as an etch stop layer, and using the electrodes 118 and 120 as an etch mask to protect the portions of the layers 332, 334 and 336 that are not etched away.

Finally, a 100 nm-thick layer of silicon nitride ($Si_3N_4$) was deposited by plasma-enhanced chemical vapor deposition (PECVD) or another suitable process over the surface of the PCS 300 through which the incident light 14 is received to form the anti-reflection coating 338. In the example shown, the anti-reflective coating extends over the electrodes 118 and 120 and the exposed surface of the first confinement layer 110.

The PCS 300 is controlled by incident light generated by a commercially-available semiconductor laser in a manner similar to the PCS 100.

The photoconductive layer 111 of the PCS 300 may additionally include a second doped sub-layer similar to the second doped sub-layer 216 of the PCS 200 shown in FIG. 5.

A chirped superlattice multilayer film may be substituted for at least one of the graded composition layers 330 and 332.

With respect to the confinement layers 110 and 112:
It is desirable that the confinement layer through which the incident light reaches the photoconductive layer 111, i.e., the first confinement layer 110 in the embodiments shown in FIGS. 3B, 5 and 6, be as thin as possible and the WB material of the confinement layer be highly transparent at the wavelength of the incident light 14 to maximize transmission of the incident light through the confinement layer to the photoconductive layer 111. In other words, it is desirable for the product of the thickness $t_c$ of the confinement layer and the absorption coefficient $\alpha_c$ of the WB material of the confinement layer to be significantly smaller than unity, i.e., $t_c \alpha_c \ll 1$. Tunnelling effects set a practical limit to the minimum thickness of the confinement layer.

Consequently, it is desirable for the absorption coefficient of the confinement layer through which the incident light reaches the photoconductive layer to be less than 100 cm$^{-1}$.

It is desirable for the WB material of the first confinement layer 110 to have a high electron mobility to provide a high conductivity. A high conductivity reduces the resistance of the conduction paths through the thickness of the first confinement layer 110 from the electrodes 118 and 120 to the photoconductive layer 111.

It is desirable for the WB material of the first confinement layer 110 to have a high doping concentration to provide the first confinement layer with a high conductivity. However, too high a doping concentration would prevent the first confinement layer of a given thickness from being fully depleted. Reducing the thickness of the first confinement layer to enable the layer to be fully depleted increases tunnelling effects. Thus, determining the doping concentration of the WB material of the first confinement layer involves a trade-off between these conflicting requirements. In an embodiment, a doping concentration of the order of $1\times10^{17}$ cm$^{-3}$ gave an acceptable compromise. A doping concentration of $1\times10^{17}$ cm$^{-3}$ was used in the examples described above.

With respect to the photoconductive layer 111:
It is desirable for the photoconductive layer 111 to be as thick as can be practically fabricated, and for the NB material of the photoconductive layer to have as high an absorption coefficient as possible at the wavelength of the incident light 14. These characteristics enable the photoconductive layer to absorb as much of the incident light 14 as possible, and therefore generate as many carriers as possible in response to the incident light. It is desirable for the product of the thickness d of the photoconductive layer and the absorption coefficient $\alpha_p$ of the NB material of the photoconductive layer at the wavelength of the incident light to be about unity or more, i.e., $d\alpha_p > \sim 1$. Process limitations on the maximum thickness of the photoconductive layer make it desirable for the absorption coefficient of the NB material of the photoconductive layer to be greater than about 1000 cm$^{-1}$ at the wavelength of the incident light. The wavelength of the incident light is chosen so that the photon energy of the incident light is greater than the band edge energy of the NB material of the photoconductive layer to maximize the absorption coefficient.

It is desirable for the NB material of the photoconductive layer 111 to have a high carrier mobility to provide the photoconductive layer with a high conductivity. A high conductivity reduces the resistance of the photoconductive layer to reduce the ON resistance $R_{on}$.

It is desirable for the NB material of the photoconductive layer to have a long carrier lifetime to increase the number of carriers that transmit the signal through the PCS 100.

It is desirable for the NB material of the undoped sub-layer 115 of the photoconductive layer 111 to have a doping concentration of less than 1×10$^{15}$ cm$^{-3}$ to reduce the OFF capacitance $C_{off}$. In the examples described above, no dopants are added to the NB material when the undoped sub-layer is grown.

The WB material of the first confinement layer 110 is described above as being Al$_y$Ga$_{1-y}$As, in which y=0.23. However, y may be in the range $0.02 \leq y \leq 1.0$. The WB material of the second confinement layer 112 is described above as being Al$_x$Ga$_{1-x}$As, in which x=0.3. However, x may be in the range $y < x \leq 1.0$. Alternative WB materials that can be used for the confinement layers 110 and 112 include (Al$_y$Ga$_{1-y}$)$_{0.5}$P ($0 \leq y \leq 1.0$) and Al$_x$Ga$_{1-x}$As ($0.02 \leq y \leq 1.0$), respectively.

Additional combinations of semiconductor materials for the first confinement layer 110 and the photoconductive layer 111 are shown in Table 1.

Combinations 2 and 3 may be deposited on a substrate of InP, which is a WB material. In PCSs fabricated using combination 2 or combination 3, the

TABLE 1

| First Confinement Layer | Photoconductive Layer |
|---|---|
| 1  Al$_y$Ga$_{1-y}$As ($0.0 < y \leq 1.0$) | In$_x$Ga$_{1-x}$As ($0.01 \leq x \leq 0.3$) |
| 2  In$_{0.5}$(Al$_x$Ga$_{1-x}$)$_{0.5}$As ($0.01 \leq x \leq 1.0$) | In$_{0.5}$Ga$_{0.5}$As |
| 3  In$_{0.5}$Al$_{0.5}$As | In$_{0.5}$Ga$_{0.5}$Sb |
| 4  Al$_x$Ga$_{1-x}$N ($0.01 < x \leq 1.0$) | GaN |
| 5  Si | Ge$_x$Si$_{1-x}$ ($0.05 \leq x \leq 1.0$) |
| 6  SiC | Si |
| 7  Zn$_y$Mg$_{1-y}$S$_z$Se$_{1-z}$ ($0.0 < y \leq 1.0$ and $0.0 < z \leq 1.0$) | ZnS$_x$Se$_{1-x}$ ($0.0 \leq x \leq 1.0$) |
| 8  Al$_x$Ga$_{1-x}$Sb ($0.1 \leq x \leq 1.0$) | GaSb |
| 9  Pb$_x$Cd$_{1-x}$Te ($0.1 \leq x \leq 1.0$) | PbTe | second confinement layer 112 can be integral with the substrate 113, and the photoconductive layer 111 can be deposited directly on the surface of the substrate. Also, combination 5 may be deposited on a substrate of silicon, which is a WB material. In PCSs with a silicon substrate, the second confinement layer can be integral with the substrate, and the photoconductive layer can be deposited directly on the surface of the substrate.

The invention is described above with reference to examples in which the incident light 14 is received through an exposed surface remote from the substrate 113. However, this is not critical to the invention. The PCS according to the invention can be controlled by light incident on the exposed surface of the substrate 113. In this case, the thickness of a portion of the substrate opposite the gap 122 can be reduced, and an anti-reflective coating can be applied to the exposed surface of the substrate.

Although this disclosure describes illustrative embodiments of the invention in detail, it is to be understood that the invention is not limited to the precise embodiments described, and that various modifications may be practiced within the scope of the invention defined by the appended claims.

We claim:

1. A photoconductive switch, comprising:
   a first confinement layer of a first semiconductor material having a first band-gap energy and a first conductivity type;
   a second confinement layer of a second semiconductor material having a second band-gap energy;
   a photoconductive layer of a third semiconductor material having a third band-gap energy and a second conductivity type, opposite to the first conductivity type, the photoconductive layer being sandwiched between the first confinement layer and the second confinement layer, the third band-gap energy being less than the first and second band-gap energies, the photoconductive layer including:
      a doped sub-layer in contact with the first confinement layer, and
      an undoped sub-layer adjacent the second confinement layer; and
   a first electrode and a second electrode separated from each other by a gap, and located on a surface of the first confinement layer remote from the photoconductive layer.

2. The photoconductive switch of claim 1, in which:
   the doped sub-layer is a first doped sub-layer; and
   the photoconductive layer additionally includes a second doped sub-layer in contact with the second confinement layer.

3. The photoconductive switch of claim 2, in which:
   the first conductivity type is n-type;
   the third semiconductor material is doped p-type in the first doped sub-layer and in the second doped sub-layer; and
   the third semiconductor material lacks added dopant in the undoped sub-layer.

4. The photoconductive switch of claim 3, in which the third semi-conductor material has a hole concentration of less than about 1×10$^{15}$ cm$^{-3}$ in the undoped sub-layer.

5. The photoconductive switch of claim 1, in which the first band gap energy and the second band-gap energy are each at least about 25 meV greater than the third band-gap energy.

6. The photoconductive switch of claim 1, additionally comprising one of (a) a graded composition layer, and (b) a chirped super lattice multi-layered film sandwiched between the photoconductive layer and the first confinement layer.

7. The photoconductive switch of claim 1, in which:
   the photoconductive switch additionally comprises a light source positioned to illuminate the photoconductive layer with incident light;
   the first confinement layer and the photoconductive layer respectively have a thickness of $t_c$ and d;
   the first semiconductor material and the third semiconductor material respectively have an absorption coefficient of $\alpha_c$, and $\alpha_p$ with respect to the incident light;
   a product $t_c \alpha_c$ of the thickness of the first confinement layer and the absorption coefficient of the first semiconductor material has a value that is small compared with unity; and a product $d\alpha_p$ of the thickness of the photoconductive layer and the absorption coefficient of the third semiconductor material has a value greater than about unity.

8. The photoconductive switch of claim 1, in which the first semiconductor material is $Al_yGa_{1-y}As$, where $0.02 \leq y \leq 1.0$, and the second semiconductor material is $Al_xGa_{1-x}As$, where x>y.

9. The photoconductive switch of claim 1, in which the first semiconductor material is $(Al_yGa_{1-y})_{0.5}In_{0.5}P$, where $0 \leq y \leq 1.0$, and the second semiconductor material is $Al_xGa_{1-x}As$, where $0.02 \leq x \leq 1.0$.

10. The photoconductive switch of claim 1, in which the third semiconductor material is GaAs.

11. The photoconductive switch of claim 1, in which the first semiconductor material and the third semiconductor material are one of the following pairs of semiconductor materials:

(a) $Al_yGa_{1-y}As$, in which $0.0<y \leq 1.0$, and $In_xGa_{1-x}As$, in which $0.01 \leq x \leq 0.3$;

(b) $In_{0.5}(Al_xGa_{1-x})_{0.5}As$, in which $0.01 \leq x \leq 1.0$, and $In_{0.05}Ga_{0.5}As$;

(c) $In_{0.5}Al_{0.5}As$, and $In_{0.5}Ga_{0.5}Sb$;

(d) $Al_xGa_{1-x}N$, in which $0.01 \leq x \leq 1.0$, and GaN;

(e) Si and $Ge_xSi_{1-x}$, in which $0.05 \leq x \leq 1.0$;

(f) SiC and Si;

(g) $Zn_yMg_{1-y}S_zSe_{1-z}$, in which $0.0<y \leq 1.0$ and $0.0<z \leq 1.0$, and $ZnS_xSe_{1-x}$, in which $0.0<x<1.0$;

(h) $Al_xGa_{1-x}Sb$, in which $0.1 \leq x \leq 1.0$, and GaSb; and (i) $Pb_xCd_{1-x}Te$, in which $0.1 \leq x \leq 1.0$, and PbTe.

12. The photoconductive switch of claim 1, in which:

the first conductivity type is n-type;

the third semiconductor material is doped p-type in the first doped sub-layer and in the second doped sub-layer; and the third semiconductor material lacks added dopant in the undoped sub-layer.

13. The photoconductive switch of claim 12, in which the third semi-conductor material has a hole concentration of less than about $1 \times 10^{15}$ cm$^{-3}$ in the undoped sub-layer.

14. The photoconductive switch of claim 1, in which:

the doped sub-layer has a thickness;

the third semiconductor material has a hole concentration in the doped sub-layer; and a product of the thickness and the hole concentration is in the range from $1 \times 10^{11}$ to $5 \times 10^{12}$ cm$^{-3}$.

15. The photoconductive switch of claim 1, in which the product of the thickness and the hole concentration is in the range from $2 \times 10^{11}$ to $2 \times 10^{12}$ cm$^{-3}$.

16. The photoconductive switch of claim 1, additionally comprising a non-reflective coating on the surface of the first confinement layer.

17. The photoconductive switch of claim 1, additionally comprising a contact layer between the first confinement layer and the first electrode and between the first confinement layer and the second electrode.

18. The photoconductive switch of claim 17, in which the contact layer is a layer of n-type semiconductor material having an impurity concentration of at least $1 \times 10^{19}$ cm$^{-3}$.

19. The photoconductive switch of claim 18, in which:

the semiconductor material of the contact layer is $In_xGa_{1-x}As$, in which $0.1 \leq x \leq 1$ and the first and second electrodes include platinum.

20. The photoconductive switch of claim 1, additionally comprising:

a contact layer;

a cap layer; and a graded composition layer sandwiched in order between the first confinement layer and the first electrode and between the first confinement layer and the second confinement layer.

* * * * *